(12) United States Patent
Atesoglu

(10) Patent No.: US 8,143,962 B1
(45) Date of Patent: Mar. 27, 2012

(54) TUNING CIRCUIT WITH A WIDE TUNING RANGE

(75) Inventor: Ali Atesoglu, Milpitas, CA (US)

(73) Assignee: Altera Corporation, San Jose, CA (US)

( * ) Notice: Subject to any disclaimer, the term of this patent is extended or adjusted under 35 U.S.C. 154(b) by 112 days.

(21) Appl. No.: 12/562,165

(22) Filed: Sep. 18, 2009

(51) Int. Cl.
*H03B 5/12* (2006.01)
(52) U.S. Cl. .............................. 331/177 V; 331/117 FE
(58) Field of Classification Search .............. 331/177 V, 331/117 FE
See application file for complete search history.

(56) References Cited

U.S. PATENT DOCUMENTS

| | | | |
|---|---|---|---|
| 2008/0136544 A1* | 6/2008 | Tang | 331/177 V |
| 2008/0309423 A1* | 12/2008 | Itoh et al. | 331/117 FE |

* cited by examiner

*Primary Examiner* — Joseph Chang
(74) *Attorney, Agent, or Firm* — Womble Carlyle Sandridge & Rice LLP

(57) ABSTRACT

Tuning circuits with a wide tuning range and a method of tuning an integrated circuit (IC) are disclosed. An embodiment of the disclosed circuits includes varactor banks coupled in series. Each of the varactor banks may include multiple variable capacitors coupled in parallel. A control voltage is routed through the series of varactor banks to adjust the frequency range of the tuning circuit. The control voltage can be selectively routed through one or more of the series of varactor banks based on the operating frequency of the tuning circuit. Enable circuits may be used to control how the control voltage is routed to achieve a specific frequency.

21 Claims, 6 Drawing Sheets

TUNING CIRCUIT WITH A WIDE TUNING RANGE

BACKGROUND

Integrated circuits (ICs), used in a variety of applications, generally include high speed transceiver blocks. High speed receivers and transceivers are used in system on chip (SOC) applications that require a wide frequency tuning range. An inductance-capacitance voltage-controlled oscillator (LC-VCO) is generally used to control the tuning frequency of transceiver blocks in an IC. The tuning range of the LC-VCO consequently determines the tuning range of the transceivers in the IC.

An LC-VCO may be constructed with an inductor (L) and a variable capacitor (C), formed by one or more varactors. For example, the variable capacitor may be a pair of varactors coupled to a control voltage from a charge pump, where the capacitance is controlled by varying the control voltage. The inductor and variable capacitor form an inductor-capacitor (LC) parallel resonance tank. As the capacitance of the variable capacitor (C) is controlled by the control voltage, the oscillating frequency, $f_{osc}$, of the LC parallel resonance tank may be represented by the following equation:

$$f_{osc,min} < f_{osc} < f_{osc,max} \text{ or } \frac{1}{\sqrt{LC_{var,max}}} < 2\pi * f_{osc} < \frac{1}{\sqrt{LC_{var,min}}}$$

Thus, based on the above equation, the capacitance of the LC tank is inversely proportional to the oscillating frequency. In other words, increasing the capacitance decreases the minimum and maximum oscillating frequencies, and decreasing the capacitance increases the minimum and maximum frequencies. As such, to achieve a maximum frequency tuning range, the capacitance needs to be fully controllable. In general, the inductance (L) may be fixed and the capacitance (C) is controlled by a control voltage. An additional capacitor may be incorporated into the circuit in order to lower the oscillating frequency. However, as the additional capacitor is generally not coupled to the control voltage, the change in the oscillating frequency may not be fully adjustable at the lower frequency range.

Therefore, in order to achieve a wider tuning range, it is desirable to be able to control or tune all the capacitors in the LC tank in order to tune the circuit even when the circuit is operating at a lower frequency. It is within this context that the invention arises.

SUMMARY

Embodiments of the present invention include circuits and a method for achieving a wider tuning range in a tuning circuit.

It should be appreciated that the present invention can be implemented in numerous ways, such as a process an apparatus, a system, a device or a method on a computer readable medium. Several inventive embodiments of the present invention are described below.

In one embodiment, a tuning circuit is disclosed. The tuning circuit has multiple varactor banks coupled in series. Varactors are variable capacitors and varactor banks, in this context, are multiple varactors that are coupled together. A voltage level is selectively routed through one or more of the varactor banks in the series. The control voltage can be used to adjust a frequency range of the tuning circuit. In one embodiment, the control voltage is routed through all the series coupled varactor banks when the circuit is tuned to operate at a high frequency. In another embodiment, the control voltage is only routed through selected varactor banks in the series when the circuit is tuned to operate at a lower frequency.

In another embodiment, an integrated circuit (IC) is disclosed. The IC has a pair of cross coupled transistors with multiple varactor banks coupled in between the pair of transistors. In one embodiment, the pair of transistors includes a PMOS and an NMOS transistor. The varactor banks are coupled in series, with one end coupled to the transistors. A switch is also coupled to the series of varactor banks. The switch can be configured to allow a control voltage, which is received by the switch, to pass through a number of the varactor banks that are coupled in series. The IC may also include another pair of cross coupled transistors that is coupled to another end of the series of varactor banks.

In yet another embodiment in accordance with the present invention, a method for tuning an IC is disclosed. The method includes receiving a control voltage at an input. The control voltage is transmitted to multiple varactor banks through enable circuits that are coupled to the varactor banks. In one embodiment, the varactor banks are groups of variable capacitors that are coupled in series. An enable signal is received at each of the enable circuits. The enable signal selectively enables one or more of the enable circuits. The control voltage is then transmitted to one or more of the varactor banks through the enable circuits based on the enable signal received. The IC is tuned based on how the control voltage is routed. In one embodiment, the IC is tuned to operate at a high frequency when the control voltage is routed across all the varactor banks.

Other aspects of the invention will become apparent from the following detailed description, taken in conjunction with the accompanying drawings, illustrating by way of example the principles of the invention.

BRIEF DESCRIPTION OF THE DRAWINGS

The invention may best be understood by reference to the following description taken in conjunction with the accompanying drawings in which.

DETAILED DESCRIPTION

The following embodiments describe circuits and a method for achieving a wider tuning range in a tuning circuit.

It will be obvious, however, to one skilled in the art, that the present invention may be practiced without some or all of these specific details. In other instances, well-known operations have not been described in detail in order not to unnecessarily obscure the present invention.

The embodiments described herein provide techniques to create a voltage-controlled oscillator (VCO) circuit with a wide tuning range. The disclosed embodiments provide a tunable VCO circuit even when the circuit is operating at a lower frequency. In one embodiment, the VCO circuit includes varactor banks or voltage-controlled variable capacitors connected in series. The capacitors can be configured to tune the VCO circuit to a desired frequency. For instance, when the VCO circuit is operating at a high frequency, more capacitors are connected in series, i.e., lower total capacitance, to the inductor-capacitor (LC) parallel resonance tank. When the VCO is operating at a low frequency, fewer capacitors are connected in series, i.e., higher total capacitance, to the LC tank. Since the capacitors are connected in series, more capacitors would lower the total capacitance as the total capacitance in series is:

$$\frac{1}{\frac{1}{C1}+\frac{1}{C2}+\cdots \frac{1}{Cn}}.$$

Therefore, connecting more capacitors in series would lower the total capacitance value in the VCO circuit and increase the frequency of the circuit. In another embodiment, the capacitors in the VCO circuit are coupled to a control voltage. Hence, the VCO circuit is tunable even when the circuit is operating at a lower frequency. Using varactor banks or variable capacitors coupled in series in a tuning circuit gives the tuning circuit a much wider tuning range as illustrated further below.

Figure 1:
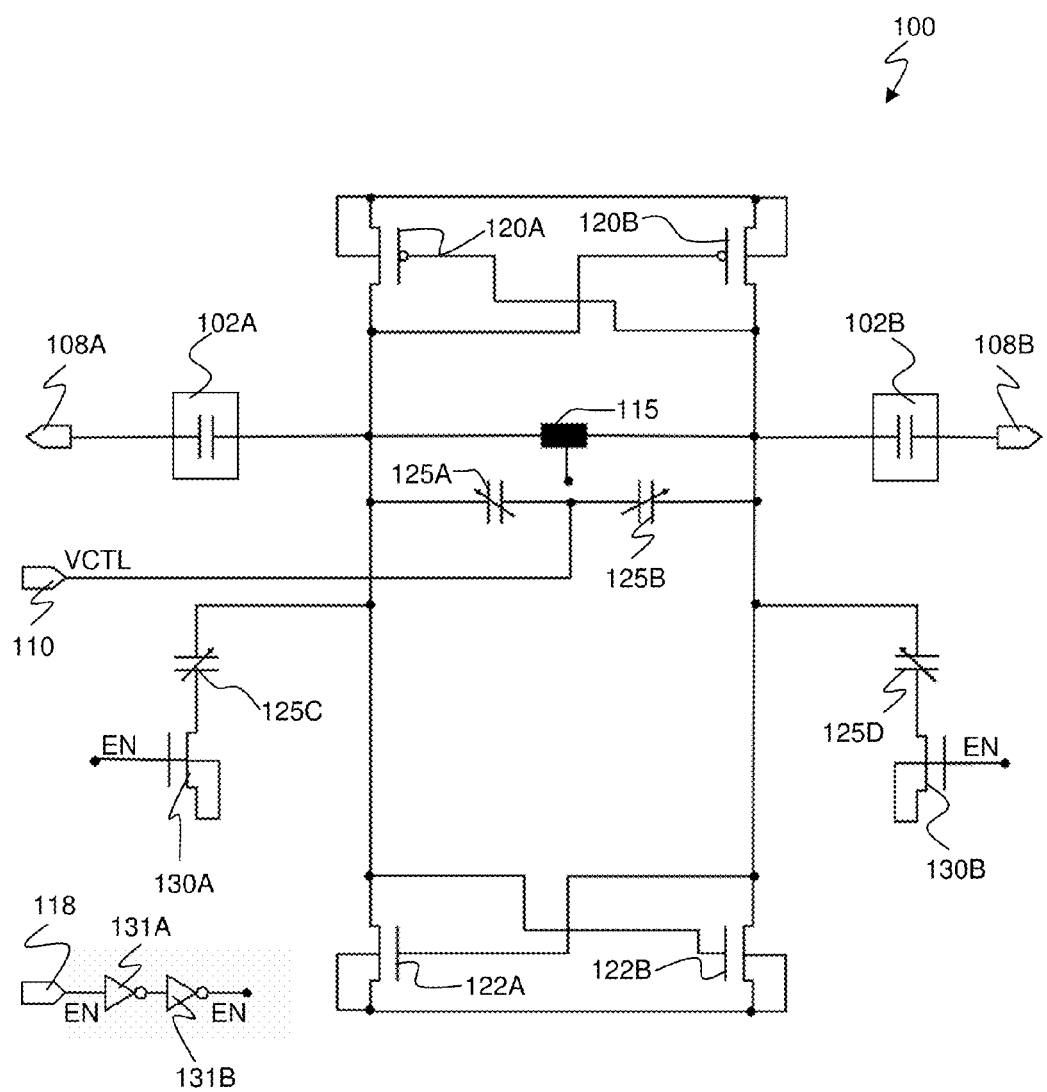
FIG. 1, meant to be illustrative and not limiting, shows a VCO circuit with an LC tank and two output pins.

FIG. 1, meant to be illustrative and not limiting, shows VCO circuit 100 with an LC tank and output pins 108A and 108B. In one embodiment, output signals at output pins 108A and 108B are 180° out-of-phase with one another. Capacitors 102A and 102B, coupled to output pins 108A and 108B, respectively, are used to prevent external voltage from flowing into the LC tank. The LC tank in VCO circuit 100 includes inductor 115 and varactor banks or variable capacitors 125A and 125B. In one known arrangement, the inductance of inductor 115 is fixed, e.g., at 350 pico-Henry (pH). Because the inductance is fixed, increasing and decreasing the total capacitance will decrease and increase, respectively, the oscillating frequency of VCO circuit 100. P-type metal-oxide-semiconductor field-effect transistors (PMOS) 120A and 120B are cross-coupled with N-type P-type metal-oxide-semiconductor field-effect transistors (NMOS) 122A and 122B, respectively. The two pairs of cross-coupled transistors create a gain on both sides of VCO circuit 100 to drive oscillation in VCO circuit 100. VCO circuit 100 remains in oscillation as long as the gain of the cross-coupled transistors 120A/B and 122A/B is greater than the total resistance of the LC tank in VCO circuit 100.

Referring still to FIG. 1, variable capacitors 125A and 125B are directly coupled to a control voltage (VCTL) at input pin 110. The oscillating frequency of VCO circuit 100 is tuned by VCTL. Even though VCTL can be used to tune the oscillating frequency of VCO circuit 100, the VCO circuit is only tunable when it is operating at a high frequency. Since VCTL is coupled only to capacitors 125A and 125B, VCTL cannot be used to control or tune VCO circuit 100 when the circuit is operating at a lower frequency. To operate at a lower frequency, the total capacitance in the LC tank needs to be increased. In the arrangement of VCO circuit 100, when the circuit is operating at a lower frequency, capacitors 125C and 125D are enabled. Both capacitors 125C and 125D can be selectively enabled through switches 130A and 130B, respectively. Enable signal (EN), received at input pin 118 and buffered by inverters 131A and 131B, controls switches 130A and 130B. In one known arrangement, when EN is at a logic high level, switches 130A and 130B are enabled to drive capacitors 125C and 125D, respectively. Thus, to operate VCO circuit 100 at a lower frequency, e.g., below 10 GHz, capacitors 125C and 125D are enabled so that the total capacitance in the LC tank of VCO circuit 100 is increased. In the illustrative embodiment of FIG. 1, capacitors 125C and 125D, when enabled, are connected in parallel to capacitors 125A and 125B, respectively. However, VCO circuit 100 is not completely tunable when the circuit is operating at a lower frequency because VCTL, the control voltage which tunes the oscillating frequency, is not connected to capacitors 125C and 125D. VCO circuit 100 therefore has a substantially limited tuning range when operating at a lower frequency.

Figure 2A:
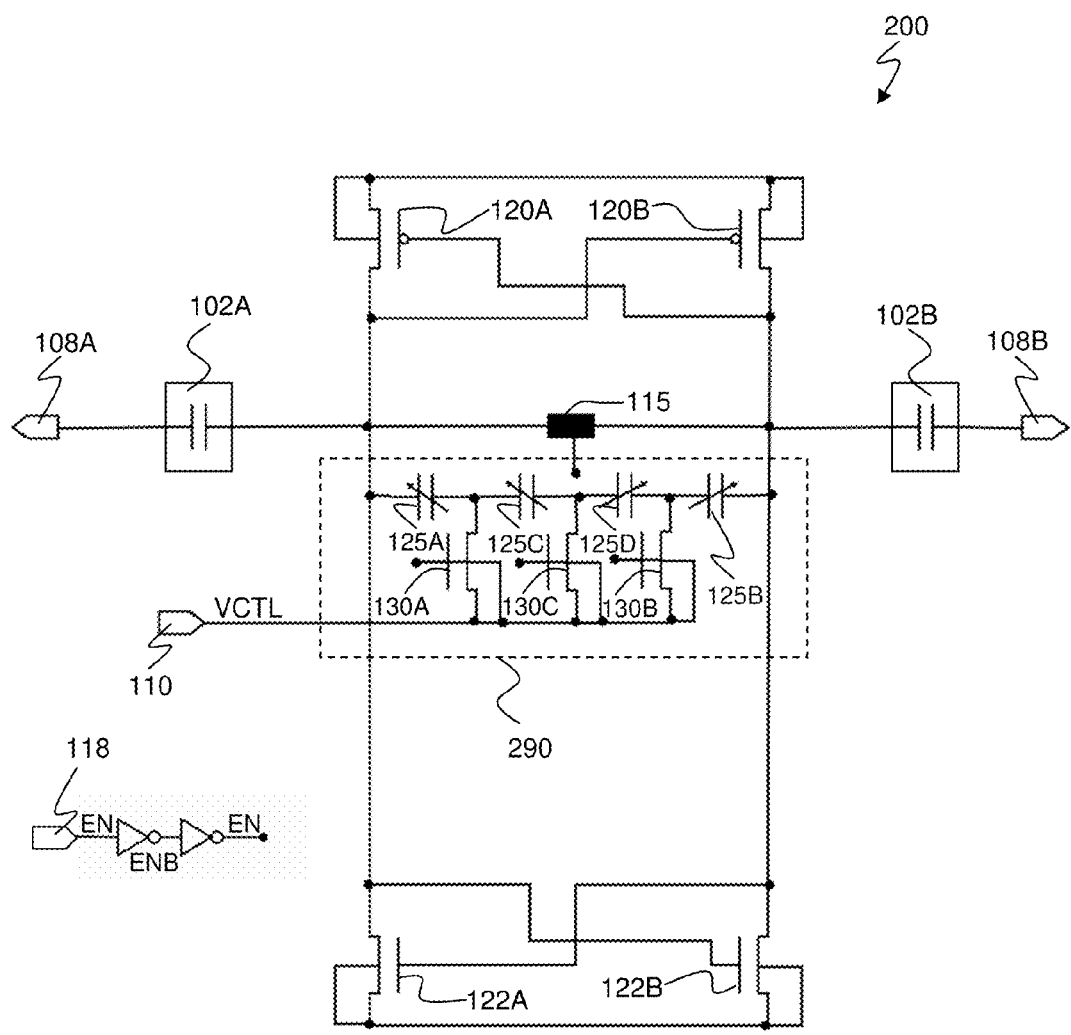
FIG. 2A, meant to be illustrative and not limiting, shows a VCO circuit with multiple capacitors connected in series as one embodiment in accordance with the present invention.

FIG. 2A, meant to be illustrative and not limiting, shows VCO circuit 200 with varactor banks 125A, 125B, 125C and 125D connected in series as one embodiment in accordance with the present invention. For the sake of brevity, elements shown in FIG. 1 and described in earlier paragraphs, e.g., capacitors 102A and 102B, output pins 108A and 108B, and transistors 120A, 120B, 122A and 122B are not repeated or described in detail here. VCO circuit 200 includes configurable capacitor circuit 290. Configurable capacitor circuit 290 includes varactor banks 125A, 125B, 125C and 125D coupled in series. Each of the varactor banks may include multiple variable capacitors connected in parallel. Selector circuits 130A, 130B and 130C are coupled to the series of varactor banks 125A, 125B, 125C and 125D at each connection point between two varactor banks. Each of selector circuits 130A, 130B and 130C can be selectively enabled or disabled. In the embodiment of circuit 200, selector circuits 130A, 130B and 130C are enabled and disabled by enable signal, EN, received at input pin 118. In one embodiment, selector circuits 130A, 130B and 130C may be switches that allow the control voltage, VCTL, received at input pin 110, to pass through whenever the selector circuits are enabled. Some of the selector circuits 130A, 130B and 130C may be enabled when EN signal is high and ENB signal is low while others may be enabled when EN signal is low and ENB signal is high. Selector circuits 130A, 130B and 130C route VCTL through the series of varactor banks 125A, 125B, 125C and 125D in configurable capacitor circuit 290 based on the operating configuration of VCO circuit 200. For instance, if VCO circuit 200 is configured to operate at a high frequency band, e.g., 10 GHz and above, selector circuits 130A, 130B and 130C will be configured such that the total capacitance of configurable capacitor circuit 290 is decreased. However, if VCO circuit 200 is configured to operate at a low frequency band, selector circuits 130A, 130B and 130C will be configured such that the total capacitance of configurable capacitor circuit 290 is increased. Details of how each of selector circuits 130A, 130B and 130C can be configured and how the total capacitance can be decreased and increased are shown in FIG. 2B and explained in the following paragraph.

Figure 2B:
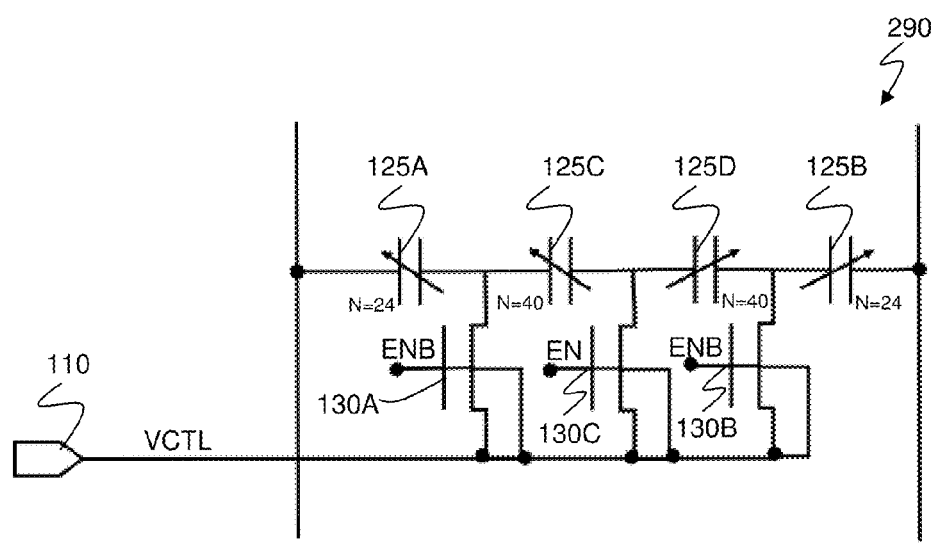
FIG. 2B, meant to be illustrative and not limiting, shows a more detailed representation of a configurable capacitor circuit as one embodiment in accordance with the present invention.

FIG. 2B, meant to be illustrative and not limiting, shows a more detailed representation of configurable capacitor circuit 290 as one embodiment in accordance with the present invention. Varactor banks 125A, 125B, 125C and 125D are coupled in series. Each varactor bank consists of multiple variable capacitors connected in parallel. For instance, each of varactor banks 125A and 125B has a total of 24 variable capacitors connected in parallel while each of varactor banks 125C and 125D has 40 variable capacitors connected in parallel in one embodiment. Three enable circuits, enable circuits 130A, 130B and 130C, are coupled to the varactor banks. In an exemplary embodiment, the enable circuits are NMOS switches that route control voltage VCTL to the series of varactor banks. Enable circuits 130A and 130B are coupled in between varactor banks 125A and 125C, and 125B and 125D, respectively, while enable circuit 130C is placed in between varactor banks 125C and 125D. Each of enable circuits 130A, 130B and 130C selectively routes control voltage VCTL from input pin 110 through the varactor banks. The frequency range of circuit 290 can be adjusted by routing control voltage VCTL through selected varactor banks.

Referring still to FIG. 2B, varactor banks 125A and 125C control the frequency range of output 108A in FIG. 2A while varactor banks 125B and 125D control the frequency range of output 108B in FIG. 2A. As mentioned above, outputs 108A and 108B may be 180° out of phase with one another. For example, output 108A may be a 0° output clock while output 108B may be a 180° output clock. To control the frequency of VCO circuit 200 of FIG. 2A, control voltage VCTL is routed through either one of the varactor banks 125A and 125B on opposite ends of circuit 290 or through all four varactor banks 125A, 125B, 125C and 125D. The total capacitance for n number of capacitors coupled in series is given by the formula:

$$C_T = \frac{1}{\frac{1}{C1} + \frac{1}{C2} + \cdots \frac{1}{Cn}}$$

Based on the above formula, to calculate the total capacitance of two capacitors coupled in series, the equation below can be used:

$$C_T = \frac{C1 \times C2}{C1 + C2}$$

Based on the formulas above, it is evident that the total capacitance in series is less than any of the individual capacitors in the series.

Thus, to increase the total capacitance in the LC tank of a VCO circuit, fewer capacitors should be connected in series. Conversely, to decrease the total capacitance in the LC tank, more capacitors should be connected in series. The oscillating frequency is given by the equation, $$f_{osc} = \frac{1}{2\pi\sqrt{LC}}.$$

Therefore, a higher capacitance value, C, would decrease the oscillating frequency while a lower capacitance value would increase the oscillating frequency. In the exemplary embodiment of FIG. 2B, two varactor banks, i.e., 125A, 125C and 125B, 125D, are coupled to each side of circuit 290. To increase the total capacitance and decrease the oscillating frequency of circuit 200 in FIG. 2A, only one varactor bank, i.e., 125A and 125B, is activated on each side of the circuit. In other words, enable circuits 130A and 130B are enabled so that control voltage VCTL is routed across varactor bank 125A on one side of circuit 290 and varactor bank 125B on another. To decrease the total capacitance and increase the oscillating frequency of circuit 200, all varactor banks, i.e., 125A, 125B, 125C and 125D, are activated. That is, enable circuit 130C is enabled and control voltage VCTL is routed across varactor banks 125C and 125A on one side of circuit 290 and varactor banks 125D and 125B on another.

In one embodiment, enable circuits 130A and 130B are enabled when the enable signal is at a logic low level, ENB, while enable circuit 130C is enabled when the enable signal is at a logic high level, EN. In another embodiment, when enable circuits 130A and 130B are enabled, enable circuit 130C is disabled and when enable circuit 130C is enabled, enable circuits 130A and 130B are disabled. Therefore, in the embodiment of FIGS. 2A and 2B, when VCO circuit 200 is operating at a lower frequency, enable signal, EN, is set to low, i.e., ENB is high, and enable circuits 130A and 130B are enabled. The total capacitance of circuit 290 increases as control voltage, VCTL, is routed across varactor banks 125A and 125B. In other words, VCTL is only routed across one varactor bank on each side of circuit 290. When VCO circuit 200 is operating at a higher frequency, enable signal, EN, is set to high, i.e., ENB is low, and only one enable circuit, enable circuit 130C, is enabled. The total capacitance of circuit 290 decreases as VCTL is routed across all varactor banks 125A, 125B, 125C and 125D in series. Even though only four varactor banks and three enable circuits are shown in circuit 290 of FIG. 2B, one skilled in the art should appreciate that more or fewer varactor banks and enable circuits can be used in this context.

Figure 3:
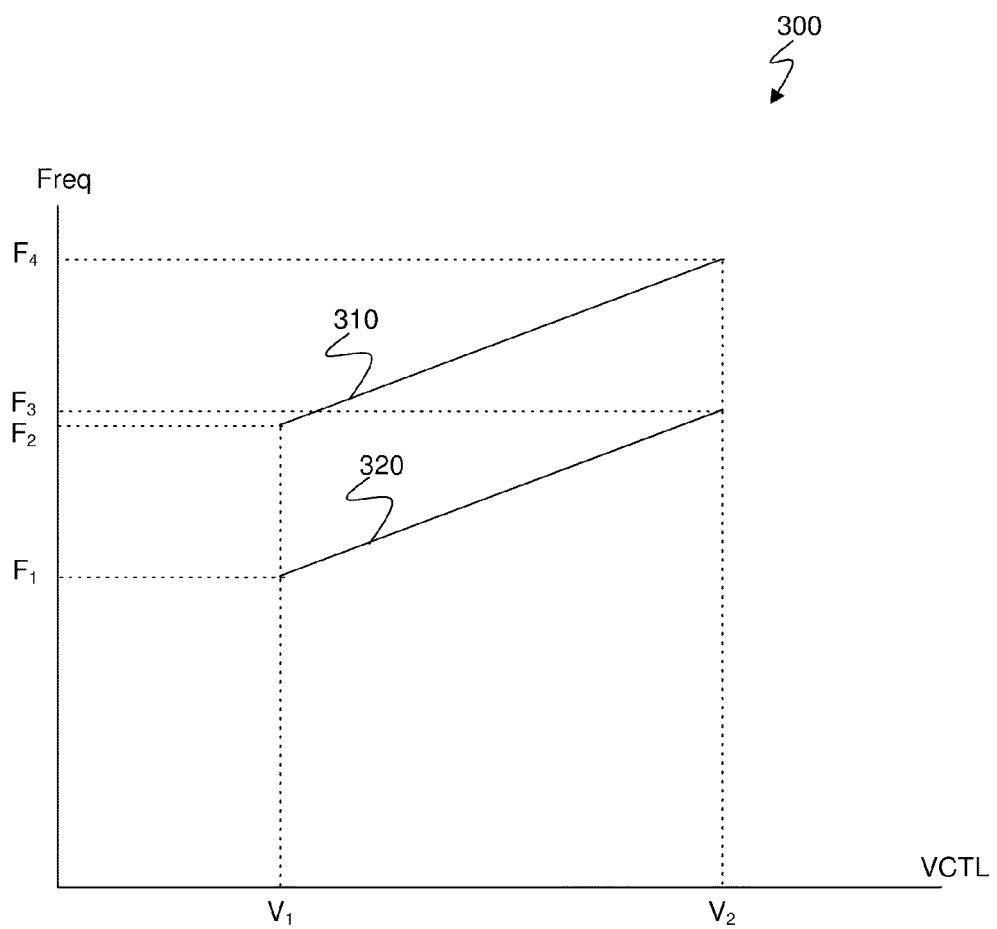
FIG. 3, meant to be illustrative and not limiting, shows an example of the output frequency of a VCO circuit as a function of a control voltage (VCTL).

FIG. 3, meant to be illustrative and not limiting, shows an example of the output frequency of VCO circuit 200 of FIG. 2A as a function of VCTL. In the embodiment of FIG. 3, the oscillating frequency of upper band 310 ranges from $F_2$ to $F_4$ for VCTL values from $V_1$ to $V_2$ and the oscillating frequency of lower band 320 ranges from $F_1$ to $F_3$ for the same VCTL values. As an exemplary embodiment, VCO circuit 200 can be configured to operate at a relatively high frequency, i.e., upper band 310, by enabling enable circuit 130C. Control voltage VCTL will be routed across every varactor bank 125 in capacitor circuit 290 and the frequency at upper band 310 can be tuned from $F_2$ to $F_4$ by VCTL input of VCO circuit 200 in FIG. 2A. As another exemplary embodiment, VCO circuit 200 can also be configured to operate at a low frequency, i.e., lower band 320, by enabling enable circuits 130A and 130B. This way, control voltage VCTL is routed only across varactor banks 125A and 125B through enable circuits 130A and 130B, respectively. The frequency at lower band 320 can be tuned from $F_1$ to $F_3$ by the control voltage, VCTL. Without configurable capacitor circuit 290 with control voltage, VCTL, coupled to each of series varactor banks 125A, 125B, 125C and 125D, the tuning range for lower band 320 would be substantially narrower. In one embodiment, the slope of lower band 320 would be substantially more level than that shown in FIG. 3 for a VCO circuit operating at a lower frequency without configurable varactor banks coupled in series.

Figure 4:
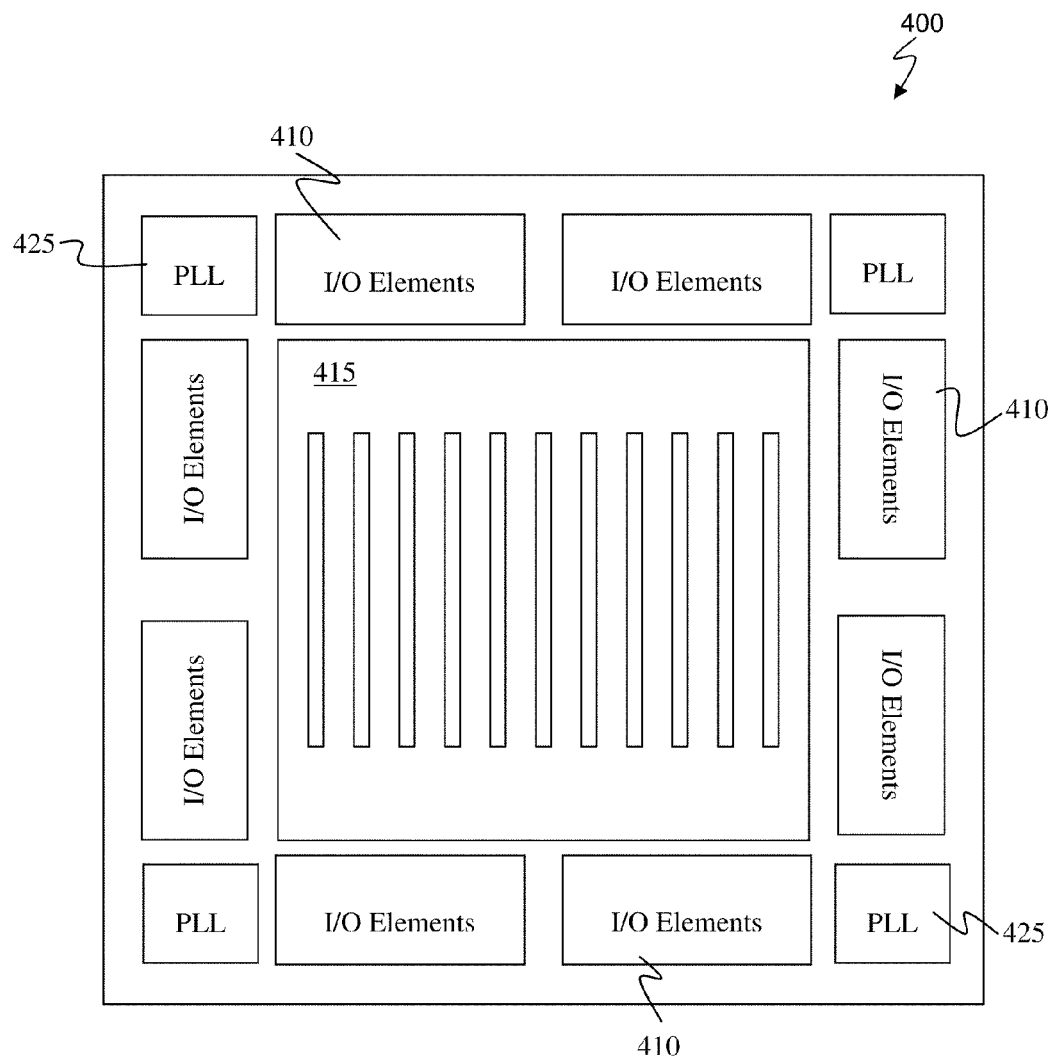
FIG. 4, meant to be illustrative and not limiting, shows a simplified block diagram of a PLD that can include aspects of the present invention.

FIG. 4, meant to be illustrative and not limiting, shows a simplified block diagram of PLD 400 that can include aspects of the present invention. Programmable device 400 includes logic region 415 and I/O elements 410. I/O elements 410 may support a variety of memory interfaces. Other auxiliary circuits such as phase-locked loops (PLLs) 425 for clock generation and timing, can be located outside the core logic region 415, e.g., at corners of programmable device 400 and adjacent to I/O elements 410. A VCO circuit, e.g., VCO circuit 200, may be incorporated into PLL 425. The control voltage, VCTL, in VCO circuit 200 may come from the charge pump of PLL 425. One skilled in the art should appreciate that the charge pump in a PLL consists of pull-up, pull-down transistors and capacitors and resistors. The control voltage is used to tune the VCO circuit to generate a desired output frequency. In this embodiment where VCO circuit 200 is incorporated into PLL 425 of PLD 400, the output frequency of the VCO circuit depends on a function of a user logic design. Therefore, enable signal EN received at input 118 of VCO circuit 200 may be driven by a configuration bit of the PLD. In one embodiment, the enable signal, EN, can set when the PLD is being configured or programmed. In another embodiment, the enable signal, EN, can be set at run time. Logic region 415 may be populated with embedded memory blocks and logic cells which include, among other things, at the most basic level, "logic elements" (LEs). LEs may include look-up table-based logic regions and these logic elements may be grouped into "Logic Array Blocks" (LABs). The logic elements and groups of logic elements or LABs can be configured to perform logical functions desired by the user.

Figure 5:
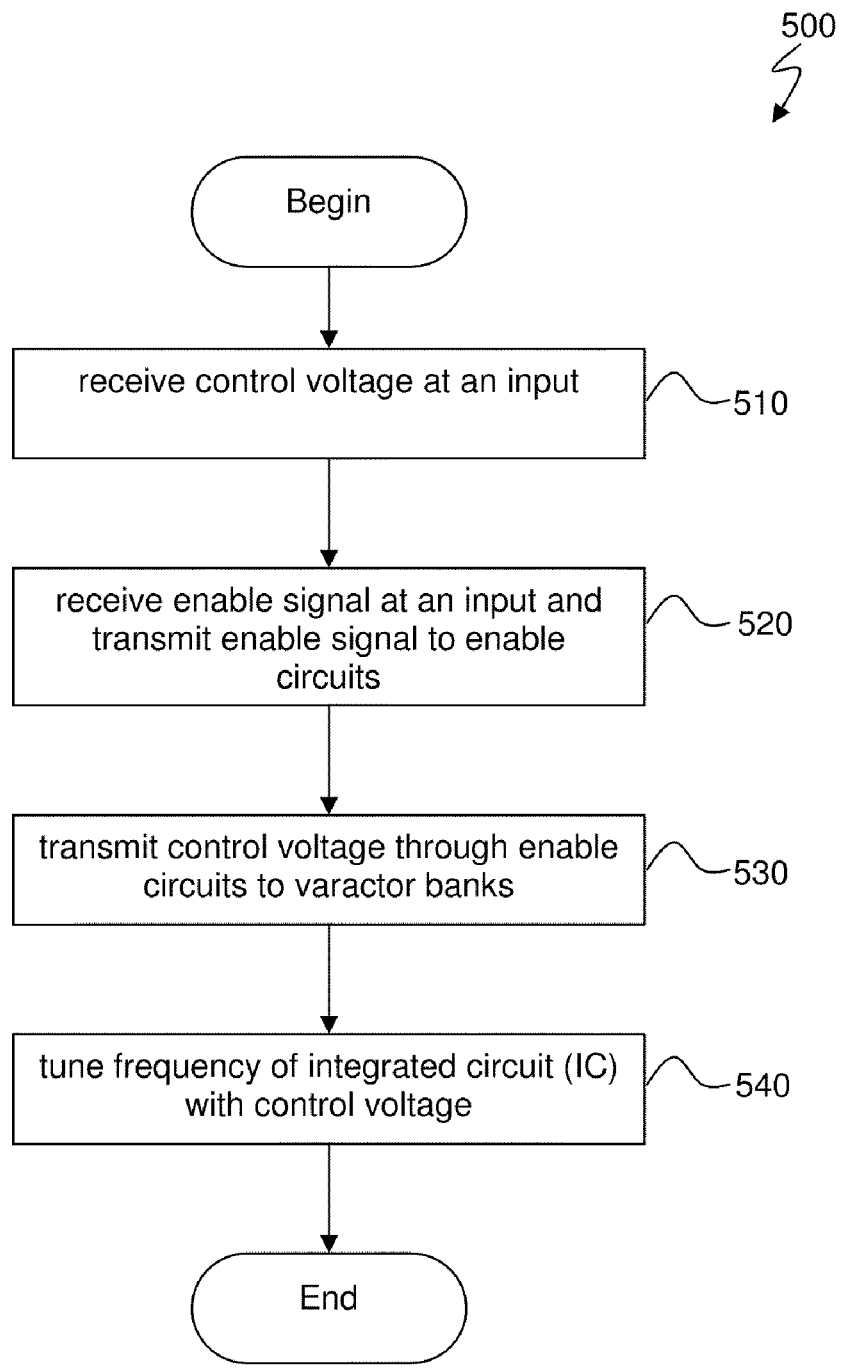
FIG. 5, meant to be illustrative and not limiting, shows a simplified method flow for tuning an IC as an embodiment in accordance with the present invention.

FIG. 5, meant to be illustrative and not limiting, shows simplified method flow 500 for tuning an IC as an embodiment in accordance with the present invention. A control voltage is received at an input in operation 510. An enable signal is received at an input and the enable signal is transmitted to enable circuits in operation 520. In the embodiment of FIG. 2A, the enable signal, EN, is received at input pin 118 and is transmitted to enable circuits 130A, 130B and 130C. In the embodiment of FIG. 2A, enable circuits 130A and 130B receives an inverted version of the enable signal, ENB. The control voltage received in operation 510 is transmitted through the enable circuits to multiple varactor banks in operation 530. In one embodiment, the varactor banks are variable capacitors coupled in series. In the embodiment of FIG. 2B, each varactor bank 125A-125D is made up of a number of variable capacitors coupled in parallel. For instance, in the illustrative example of FIG. 2B, each of varactor banks 125A and 125B has 24 variable capacitors or varactors coupled in parallel, and each of varactor banks 125C and 125D has 40 variable capacitors coupled in parallel. One skilled in the art will appreciate that alternative amounts of variable capacitors may be incorporated into each varactor bank. The control voltage is transmitted through a selected number of varactor banks based on the enable signal received in operation 520. In the embodiment of FIG. 2B, control voltage VCTL is transmitted through enable circuit 130C, when enable signal EN is at a logic high level, across varactor banks 125A and 125C, and 125D and 125B. In the same embodiment, VCTL is transmitted through enable circuits 130A and 130B, when enable signal EN is at a logic low level, across varactor banks 125A and 125B, respectively. The frequency of the IC is tuned with the control voltage in operation 540.

The embodiments, thus far, were described with respect to integrated circuits. The method and apparatus described herein may be incorporated into any suitable circuit. For example, the method and apparatus may be incorporated into numerous types of devices such as microprocessors or programmable logic devices. Exemplary programmable logic devices include programmable array logic (PAL), programmable logic array (PLA), field programmable logic array (FPLA), electrically programmable logic devices (EPLD), electrically erasable programmable logic device (EEPLD), logic cell array (LCA), field programmable gate array (FPGA), application specific standard product (ASSP), application specific integrated circuit (ASIC), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A tuning circuit comprising:
a plurality of varactor banks coupled in series;
a plurality of enable circuits, each of the plurality of enable circuits having a first node coupled to a first trace operable to provide a voltage level, each of the plurality of enable circuits having a second node coupled to a different pair of the plurality of varactor banks, wherein the voltage level is selectively routed through one or more of the plurality of varactor banks.

2. The tuning circuit of claim 1, wherein the plurality of enable circuits are controlled through a single input pin.

3. The tuning circuit of claim 1, wherein each of the plurality of enable circuits couples to an input of different ones of multiple inverters coupled in series.

4. The tuning circuit of claim 2, wherein each of the plurality of enable circuits is enabled and disabled with a logic level.

5. The tuning circuit of claim 1, wherein the voltage level is routed through each of the plurality of varactor banks when the tuning circuit is operating at a frequency greater than.

6. The tuning circuit of claim 1, wherein each of the plurality of varactor banks comprises a plurality of configurable capacitors.

7. The tuning circuit of claim 6, wherein the plurality of configurable capacitors are coupled in parallel.

8. The tuning circuit of claim 1, wherein the tuning circuit is an inductive capacitive voltage-controlled oscillator (LC-VCO) circuit.

9. The tuning circuit of claim 1, wherein the voltage level is adjustable.

10. An integrated circuit (IC), comprising:
a first pair of cross coupled transistors;
a second pair of cross coupled transistors;
a plurality of varactor banks coupled in series, the plurality of varactor banks coupled to the first pair of transistors and the second pair of transistors; and
a plurality of switches coupled to a control voltage, each of the plurality of switches coupled to a different pair of the plurality of varactor banks, wherein the different pairs of the plurality of varactor banks are coupled in series and wherein each of the plurality of switches shares a common enable signal.

11. The IC of claim 10, further comprising:
an input pin providing the common enable signal to each of the plurality of switches.

12. The IC of claim 11, wherein the first pair of cross coupled transistors comprises a pair of transistors of a first type and the second pair of cross coupled transistors comprises a pair of transistors of a second type.

13. The IC of claim 10, further comprising:
multiple inverters coupled in series to the input pin, wherein each of the plurality of switches couples to an input of different ones of the multiple inverters.

14. The IC of claim 13, wherein the plurality of switches comprise NMOS switches.

15. The IC of claim 13, wherein the plurality of switches includes a first switch and a second switch, wherein if the first switch is disabled, the second switch is enabled.

16. The IC of claim 10, wherein each varactor bank in the plurality of varactor banks comprises a plurality of capacitors coupled in parallel.

17. The IC of claim 10, wherein the control voltage and the plurality of varactor banks coupled in series tune a frequency of the IC.

18. A method of tuning an integrated circuit (IC), comprising:
receiving a control voltage at a control voltage input;
transmitting the control voltage to a plurality of varactor banks through a plurality of enable circuits, wherein each of the plurality of enable circuits is coupled to different pairs of the plurality of varactor banks, and wherein each of the plurality of varactor banks is coupled in series;
receiving an enable signal at each of the plurality of enable circuits, wherein each of the plurality of switches couples to an input of different ones of multiple inverters coupled in series, wherein the enable signal selectively enables one or more of the plurality of enable circuits; and
wherein the control voltage tunes a frequency of the IC based on the enable signal.

19. The method of claim 18, wherein the enable signal is received from a storage element in the IC.

20. The method of claim 18, wherein the enable signal is received from a common source.

21. The method of claim 18, further comprising:
increasing a total capacitance in the IC when transmitting a first frequency; and
decreasing the total capacitance in the IC when transmitting a second frequency,
wherein the first frequency is less than the second frequency.

* * * * *